(12) United States Patent
Qureshi et al.

(10) Patent No.: US 10,594,274 B2
(45) Date of Patent: Mar. 17, 2020

(54) POWER AMPLIFIER CELL

(71) Applicant: NXP B.V., Eindhoven (NL)

(72) Inventors: Jawad Hussain Qureshi, Bemmel (NL); Mustafa Acar, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/119,692

(22) Filed: Aug. 31, 2018

(65) Prior Publication Data

US 2019/0131938 A1 May 2, 2019

(30) Foreign Application Priority Data

Oct. 31, 2017 (EP) .................................... 17199444

(51) Int. Cl.
| | |
|---|---|
| *H03F 3/45* | (2006.01) |
| *H03F 1/56* | (2006.01) |
| *H03F 1/02* | (2006.01) |
| *H03F 3/21* | (2006.01) |
| *H03F 3/19* | (2006.01) |

(Continued)

(52) U.S. Cl.
CPC ............ *H03F 1/565* (2013.01); *H03F 1/0288* (2013.01); *H03F 1/56* (2013.01); *H03F 3/19* (2013.01); *H03F 3/193* (2013.01); *H03F 3/211* (2013.01); *H03F 3/24* (2013.01); *H03F 3/45* (2013.01); *H03F 2200/09* (2013.01); *H03F 2200/387* (2013.01); *H03F 2200/451* (2013.01)

(58) Field of Classification Search
CPC ........ H03F 3/45; H03F 3/191; H03F 2200/09; H03F 2200/541
USPC .................................. 330/195, 292, 301, 302
See application file for complete search history.

(56) References Cited

U.S. PATENT DOCUMENTS

| | | | |
|---|---|---|---|
| 6,683,510 B1 * | 1/2004 | Padilla | ...................... H01P 5/10 333/25 |
| 7,629,860 B2 | 12/2009 | Liu et al. | |
| 8,232,857 B1 | 7/2012 | Wright et al. | |

(Continued)

FOREIGN PATENT DOCUMENTS

| | | |
|---|---|---|
| EP | 1 578 014 A1 | 9/2005 |
| EP | 2899803 A1 | 7/2015 |
| WO | WO-2014/195285 A1 | 12/2014 |

OTHER PUBLICATIONS

Chongchewchamnan, M. et al; "A Push-Pull Power Amplifier Using Novel Impedance-Transforming Baluns"; Proceedings of the European Microwave Conference, vol. CONF. 30; Paris, FR; pp. 337-340 (Oct. 4, 2000).

*Primary Examiner* — Steven J Mottola (57) ABSTRACT

A power amplifier cell comprising a first power amplifier, a second power amplifier and a balun. The balun comprises a first inductor and a second inductor that define a first transformer; and a third inductor and a fourth inductor that define a second transformer. The following: (i) a parasitic capacitance of the first power amplifier; (ii) a leakage inductance of the first transformer; and (iii) a capacitive coupling between the first inductor and the second inductor, contribute to a first impedance matching circuit for the first power amplifier. Also, the following (iv) a parasitic capacitance of the second power amplifier; (v) a leakage inductance of the second transformer; and (vi) a capacitive coupling between the third inductor and the fourth inductor, contribute to a second impedance matching circuit for the second power amplifier.

15 Claims, 10 Drawing Sheets

(51) Int. Cl.
*H03F 3/24* (2006.01)
*H03F 3/193* (2006.01)

(56) References Cited

U.S. PATENT DOCUMENTS

| | | |
|---|---|---|
| 9,300,022 B2 | 3/2016 | Vaisman |
| 9,362,871 B2 | 6/2016 | Qureshi |
| 2002/0067211 A1 | 6/2002 | Matsuyoshi et al. |
| 2006/0284698 A1 | 12/2006 | Vaisanen |
| 2009/0289721 A1* | 11/2009 | Rajendran ............... H03F 3/195 330/301 |
| 2016/0105154 A1 | 4/2016 | Thomas et al. |
| 2017/0077873 A1 | 3/2017 | Qureshi |

* cited by examiner

POWER AMPLIFIER CELL

CROSS-REFERENCE TO RELATED APPLICATIONS

This application claims the priority under 35 U.S.C. § 119 of European patent application no. 17199444.5, filed Oct. 31, 2018 the contents of which are incorporated by reference herein.

The present disclosure relates to power amplifier (PA) cells. In particular to PA cells that include transformers, wherein leakage inductances of the transformers are used to contribute to impedance matching circuits for associated power amplifiers.

According to a first aspect of the present disclosure there is provided a power amplifier cell comprising:
- a first input terminal configured to receive a first balanced input signal;
- a second input terminal configured to receive a second balanced input signal;
- an output terminal;
- a reference terminal;
- a first power amplifier having:
  - a first PA input terminal connected to the first input terminal;
  - a first PA output terminal;
- a second power amplifier having:
  - a second PA input terminal connected to the second input terminal;
  - a second PA output terminal;
- a balun comprising:
  - a first balanced node connected to the first PA output terminal;
  - a second balanced node connected to the second PA output terminal;
  - an unbalanced node connected to the output terminal;
  - a first inductor with a first end and a second end, the second end of the first inductor connected to the unbalanced node;
  - a second inductor with a first end and a second end, wherein the second inductor is inductively coupled to the first inductor in order to define a first transformer, the first end of the second inductor connected to the first balanced node, and the second end of the second inductor connected to the reference terminal;
  - a third inductor with a first end and a second end, wherein the first end of the third inductor is connected to the first end of the first inductor and the second end of the third inductor is connected to the reference terminal;
  - a fourth inductor with a first end and a second end, wherein the first end of the fourth inductor is connected to the second balanced node, the fourth inductor is inductively coupled to the third inductor in order to define a second transformer, and the second end of the fourth inductor is connected to the reference terminal;
  - a mutual-capacitor having a first terminal and a second terminal, the first terminal of the mutual-capacitor connected to the first end of the first inductor and the first terminal of the mutual-capacitor further connected to the first end of the third inductor, the second terminal of the mutual-capacitor connected to the reference terminal;
- wherein:
  - (i) a parasitic capacitance of the first power amplifier;
  - (ii) a leakage inductance of the first transformer; and
  - (iii) a capacitive coupling between the first inductor and the second inductor, are configured to contribute to a first impedance matching circuit for the first power amplifier; and
  - (iv) a parasitic capacitance of the second power amplifier; (v) a leakage inductance of the second transformer; and (vi) a capacitive coupling between the third inductor and the fourth inductor, are configured to contribute to a second impedance matching circuit for the second power amplifier.

By providing the impedance matching circuits in this way, the power amplifier cell can make advantageous use of the leakage inductance from the transformers, especially where the inductors/coils of the transformers are loosely coupled. That is, the leakage inductances can be used to efficiently (in terms of the number of components required and power consumption) contribute to the impedance matching circuits.

In one or more embodiments, the first impedance matching circuit is configured to provide impedance matching between the first power amplifier and the balun.

In one or more embodiments, the second impedance matching circuit is configured to provide impedance matching between second power amplifier and the balun.

In one or more embodiments, the inductive coupling of the first inductor to the second inductor has an inductive coupling factor of from 0.55 to 0.75, and/or the inductive coupling of the third inductor to the fourth inductor has an inductive coupling factor of from 0.55 to 0.75.

In one or more embodiments, the leakage inductance of the first transformer is configured to provide sufficient inductance for the first impedance matching circuit without requiring additional components to provide the inductive functionality of the first impedance matching circuit. Optionally, the leakage inductance of the second transformer is configured to provide sufficient inductance for the second impedance matching circuit without requiring additional components to provide the inductive functionality of the second impedance matching circuit.

In one or more embodiments, the first inductor comprises a first lumped equivalent of a transmission line; and/or the second inductor comprises a second lumped equivalent of a transmission line; and/or the third inductor comprises a third lumped equivalent of a transmission line; and/or the fourth inductor comprises a fourth lumped equivalent of a transmission line.

In one or more embodiments, the inductive coupling factor of the first inductor to the second inductor is defined by the relative spatial arrangement of the first inductor with respect to the second inductor; and/or the inductive coupling factor of the third inductor to the fourth inductor is defined by the relative spatial arrangement of the third inductor with respect to the fourth inductor.

In one or more embodiments, the balun further comprises a first coupling capacitor. The first coupling capacitor may comprise a first terminal and a second terminal, wherein: the first terminal of the first coupling capacitor is connected to the first end of the first inductor; and the second terminal of the first coupling capacitor is connected to the first end of the second inductor.

In one or more embodiments, the balun further comprises a second coupling capacitor. The second coupling capacitor may comprise a first terminal and a second terminal, wherein the first terminal of the second coupling capacitor is connected to the first end of the third inductor; and the second terminal of the second coupling capacitor is connected to the first end of the fourth inductor.

In one or more embodiments, the balun further comprises a load capacitor. The load capacitor may comprise a first terminal and a second terminal, wherein: the first terminal of the load capacitor is connected to the second end of the first inductor; and the second terminal of the load capacitor is connected to the reference terminal.

In one or more embodiments, the balun further comprises a first blocking capacitor. The first blocking capacitor may comprise a first terminal and a second terminal, wherein: the first terminal of the first blocking capacitor is connected to the second end of the second inductor; and the second terminal of the first blocking capacitor is connected to the reference terminal.

In one or more embodiments, the balun further comprises a second blocking capacitor. The second blocking capacitor may comprise a first terminal and a second terminal, wherein: the first terminal of the second blocking capacitor is connected to the second end of the fourth inductor; and the second terminal of the second blocking capacitor is connected to the reference terminal.

In one or more embodiments, the power amplifier cell further comprises:
- a first reactive component having a first terminal and a second terminal, wherein:
  - the first terminal of the first reactive component is connected to the first PA output terminal; and
  - the second terminal of the first reactive component is connected to the reference terminal; and/or
- a second reactive component having a first terminal and a second terminal, wherein:
  - the first terminal of the second reactive component is connected to the second PA output terminal; and
  - the second terminal of the second reactive component is connected to the reference terminal.

In one or more embodiments, the power amplifier cell further comprises:
- a first harmonic-compensation-network connected to the second inductor, the first harmonic-compensation-network comprising a first compensation capacitor and a first compensation inductor; and/or
- a second harmonic-compensation-network connected to the fourth inductor, the second harmonic-compensation-network comprising a second compensation capacitor and a second compensation inductor.

In one or more embodiments, the first harmonic-compensation-network is connected to the second end of the second inductor, and/or the second harmonic-compensation-network is connected to the second end of the fourth inductor.

In one or more embodiments, the first harmonic-compensation-network is connected to the first end of the second inductor, and/or the second harmonic-compensation-network is connected to the first end of the fourth inductor.

There may be provided a Doherty amplifier circuit, which comprises a main amplifier and a peaking amplifier, wherein the main amplifier and/or the peaking amplifier comprise any power amplifier cell disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which.

Transmitters can include RF power amplifiers. The efficiency of such an RF power amplifier (PA) is important to the efficiency of the transmitter. Moreover, it can be advantageous for the PA to be efficient over not only under maximum power conditions but also under power backed-off conditions. This can be addressed by using advanced PA concepts for example Doherty, Outphasing and envelope tracking/envelope elimination & restoration (ET/ERR) etc.

Simultaneous requirements on video & RF bandwidth, along with a desire for a high average efficiency of the design, can make the design of the PA very complicated. For example, in order to work efficiently and at the same time process wideband modulation signals, the PA can benefit from having low impedances at video frequencies, and also optimum load at fundamental and second harmonic frequencies. In the case of wideband amplifiers, it can be extremely difficult (or impossible) to meet the above stated requirements simultaneously. Moreover, if the PA cell is to be used in wideband DPA (differential power amplifier) architecture, it may also need to meet certain additional requirements such as: 1) precise 90 degree phase delay in front of a main PA (from an internal current source) in a Doherty amplifier; 2) precise 180 degree phase delay in front of a peaking PA (from an internal current source) in a Doherty amplifier; and 3) no (or only limited) impedance transformation before power combining in a Doherty amplifier.

A novel circuit will be described below, which uses differential architecture. However rather than using very tightly coupled transformers, examples of the novel circuit utilise weak coupling between coils to create an improved circuit for base-band, fundamental and second harmonic frequencies. The weak coupling can result in leakage inductances that can be used to contribute to impedance matching circuits for amplifiers in the circuit, or for multi-segment lumped equivalent of transmission lines to be used in in a DPA combiner (if the circuit is used in a DPA configuration as will be discussed below). Embodiments of the circuit can advantageously generate impedances that have a relatively constant value over a wideband frequency band, along with an option of moving the second harmonic impedances to very low or very high conditions, thus providing the possibilities of either using conventional class of operations of the PA devices or high efficiency inverse class operation.

Figure 1:
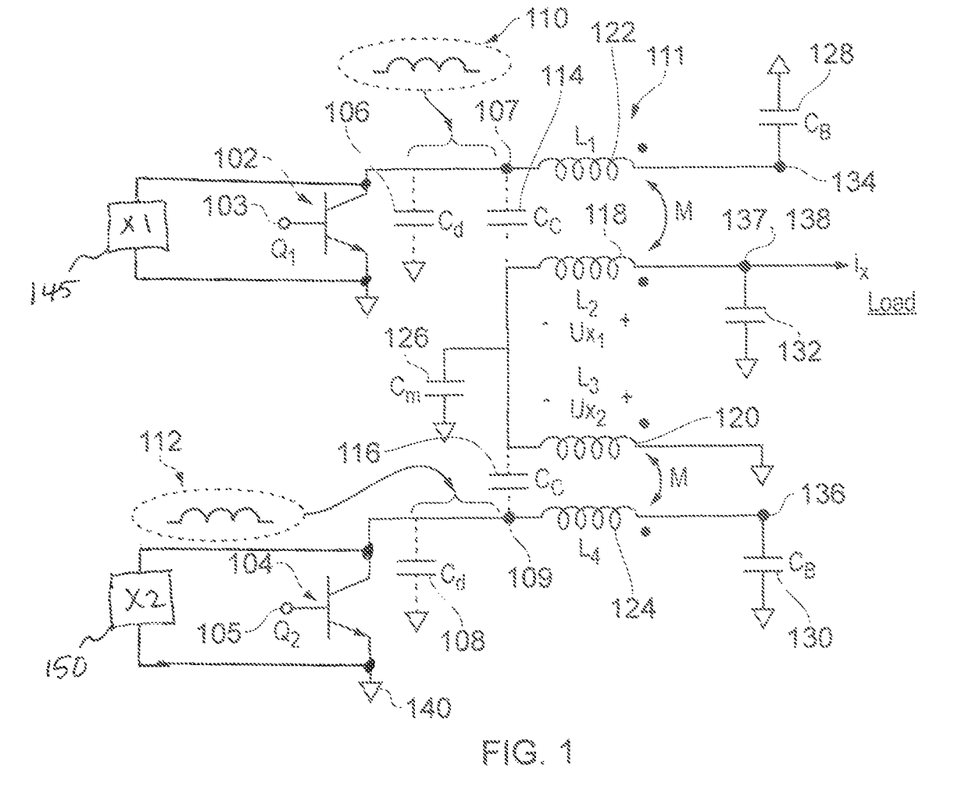
FIG. 1 shows an example embodiment of a power amplifier (PA) cell.

FIG. 1 shows an example embodiment of a power amplifier (PA) cell, which can be used in a transmitter for example.

The PA cell includes a first input terminal 103, a second input terminal 105 and a reference terminal 140. The first input terminal 103 is configured to receive a first balanced input signal, and the second input terminal 105 is configured to receive a second balanced input signal. The PA cell also includes an output terminal 138, which is configured to provide an output-current ($i_x$) to a load (not shown). In this example, the reference terminal 140 is a ground terminal.

The PA cell includes a first power amplifier (Q1) 102 and a second power amplifier (Q2) 104. In this example the power amplifiers are provided as BJTs. However, other types of transistors can be used, including MOS, CMOS, FETs, etc. As will be discussed below, the first power amplifier (Q1) 102 processes the first balanced input signal, and the second power amplifier (Q2) 104 processes the second balanced input signal.

The first power amplifier (Q1) 102 has a first PA input terminal (in this example the base of the transistor) that is connected to the first input terminal 103, and also has a first PA output terminal (in this example the collector of the transistor). Similarly, the second power amplifier (Q2) 104 has a second PA input terminal (base) connected to the second input terminal 105, and also has a second PA output terminal (collector).

The PA cell includes a balun 111, which has a first balanced node 107, a second balanced node 109, and an unbalanced node 137. The unbalanced node 137 is connected to the output terminal 138. The first balanced node 107 is connected to the first PA output terminal (the collector of Q1). The second balanced node is connected to the second PA output terminal (the collector of Q2). In this way, the two power amplifiers (Q1, Q2) 102, 104 can be considered as a differential pair for exciting the balun 111.

The balun 111 has a first inductor (L2) 118 with a first end and a second end, and also has a second inductor (L1) 122 with a first end and a second end. The second inductor (L1) 122 is inductively coupled to the first inductor (L2) 118 in order to define a first transformer. The second end of the first inductor (L2) 118 is connected to the unbalanced node 138. The first end of the second inductor (L1) 122 is connected to the first balanced node 107. The second end of the second inductor (L1) 122 is connected to the reference terminal 140, either directly or indirectly as shown in FIG. 1.

The balun 111 has a third inductor (L3) 120 with a first end and a second end, and a fourth inductor (L4) 124 with a first end and a second end. The fourth inductor (L4) 124 is inductively coupled to the third inductor (L3) 120 in order to define a second transformer. The first end of the third inductor (L3) 120 is connected to the first end of the first inductor (L2) 118. The second end of the third inductor (L3) 120 is connected to the reference terminal 140. The first end of the fourth inductor (L4) 124 is connected to the second balanced node 109. The second end of the fourth inductor (L4) 124 is connected to the reference terminal 140, either directly or indirectly as shown in FIG. 1.

In this example, the balun 111 also includes a mutual-capacitor (Cm) 126 having a first terminal and a second terminal. The first terminal of the mutual-capacitor (Cm) 126 is connected to the first end of the first inductor (L2) 118. The first terminal of the mutual-capacitor (Cm) 126 is also connected to the first end of the third inductor (L3) 120. The second terminal of the mutual-capacitor (Cm) 126 is connected to the reference terminal 140. This mutual-capacitor (Cm) 126 can form part of an output matching network/lumped transmission lines in the case of odd-mode/differential excitation.

Shown schematically in FIG. 1 is a leakage inductance 110 of the first transformer. This leakage inductance 110 can be considered as being in series between the first PA output terminal (the collector of the transistor, Q1) and the first balanced node 107. The value of the leakage inductance 110 is defined by the degree of inductive coupling of the first inductor (L2) 118 to the second inductor (L1) 122. In this example, the inductive coupling of the first inductor (L2) 118 to the second inductor (L1) 122 is relatively weak/loose and has an inductive coupling factor of from 0.55 to 0.75. In other examples, it may be between less than 0.8, or less than 0.7. Using a relatively low coupling factor is counter-intuitive because circuit designers usually design transformers to have as high an inductive coupling factor as possible.

Similarly, FIG. 1 shows a leakage inductance 112 of the second transformer, in series between the second PA output terminal (the collector of the transistor, Q2) and the second balanced node 109. The value of the leakage inductance 112 of the second transformer can be defined by an inductive coupling of the third inductor (L3) 120 to the fourth inductor (L4) 124, that is in one of the ranges discussed above with reference to the leakage inductance 110 of the first transformer.

The inductive coupling factor of the first inductor (L2) 118 to the second inductor (L1) 122 is defined by, amongst other things, the relative spatial arrangement of the first inductor (L2) 118 with respect to the second inductor (L1) 122; and the inductive coupling factor of the third inductor (L3) 120 to the fourth inductor (L4) 124 is defined by the relative spatial arrangement of the third inductor (L3) 120 with respect to the fourth inductor (L4) 124.

As will be discussed below, the level of inductive coupling between the first inductor (L2) 118 and the second inductor (L1) 122, and between the third inductor (L3) 120 and the fourth inductor (L4) 124, can be set such that the leakage inductances 110, 112 provide sufficient inductance for respective impedance matching circuits without requiring additional components to provide the inductive functionality of the impedance matching circuit.

FIG. 1 shows that the balun 111 also comprises a first coupling capacitor ($C_c$) 114 and a second coupling capacitor ($C_c$) 116. These coupling capacitors 114, 116 may be provided by discrete capacitor components, or the associated capacitances may be provided by the inherent capacitive coupling between the associated inductors (or any other components or signal paths within the balun 111).

The first coupling capacitor ($C_c$) 114 has a first terminal and a second terminal. The first terminal of the first coupling capacitor ($C_c$) 114 is connected to the first end of the first inductor (L2) 118. The second terminal of the first coupling capacitor ($C_c$) 114 is connected to the first end of the second inductor (L1) 122. The second coupling capacitor ($C_c$) 116 also has a first terminal and a second terminal. The first terminal of the second coupling capacitor ($C_c$) 116 is connected to the first end of the third inductor (L3) 120. The second terminal of the second coupling capacitor ($C_c$) 116 is connected to the first end of the fourth inductor (L4) 124.

A parasitic capacitance of the first power amplifier (Q1) 102, is represented in FIG. 1 as a first device-capacitor 106. Similarly, a parasitic capacitance of the second power amplifier (Q2) 104, is represented in FIG. 1 as a second device-capacitor 108. The device-capacitors 106, 108 are shown in series between: (i) the associated PA output terminal (collector) of the power amplifier; and (ii) the reference terminal 140.

The following components of the PA cell can be considered as contributing to an impedance matching circuit for the first power amplifier (Q1) 102:
 (i) the parasitic capacitance 106 of the first power amplifier (Q1) 102;
 (ii) the leakage inductance 110 of the first transformer; and
 (iii) the capacitive coupling ($C_c$) 114 between the first inductor (L2) 118 and the second inductor (L1) 122.

Similarly, the following components can be considered as contributing to an impedance matching circuit for the second power amplifier (Q2) 104:
 (iv) the parasitic capacitance 108 of the second power amplifier (Q2) 104;
 (v) the leakage inductance 112 of the second transformer; and
 (vi) the capacitive coupling ($C_c$) 116 between the third inductor (L3) 120 and the fourth inductor (L4) 124.

In this way, the first impedance matching circuit can provide impedance matching between the first power amplifier (Q1) 102 and the balun 111. Similarly, the second impedance matching circuit can provide impedance matching between second power amplifier (Q2) 104 and the balun 111. By providing the impedance matching circuits in this way, the circuit can make advantageous use of the leakage inductance from the transformers, especially where the inductors/coils of the transformers are loosely coupled. That is, the leakage inductances can be used to efficiently (in terms of the number of components required and power consumption) contribute to the impedance matching circuits.

In some examples additional components may also be used for the impedance matching circuits. For example, to increase or decrease the capacitance of the parasitic capacitances 106, 108 and/or the capacitive couplings ($C_c$) 114, 116.

For instance, additional reactive components can be provided in series between: (i) a PA output terminal (collector) of the or each power amplifier (Q1, Q2) 102, 104; and (ii) the reference terminal 140. In this way, functionally they are in parallel with the associated parasitic capacitance 106, 108 of the power amplifier (device-capacitor 106). Use of such reactive components can be used to adjust the operation of the impedance matching circuits, for example so that they can be tuned to a specific application.

More specifically, a first reactive component (X1) 145 can be used that has a first terminal and a second terminal. The first terminal of the first reactive component can be connected to the first PA output terminal (collector of Q1); and the second terminal of the first reactive component can be connected to the reference terminal 140. A second reactive component (X2) 150 can be used that has a first terminal and a second terminal. The first terminal of the second reactive component can be connected to the second PA output terminal (collector of Q2). The second terminal of the second reactive component can be connected to the reference terminal 140.

In the example of FIG. 1, the balun 111 further comprises a first blocking capacitor ($C_B$) 128 and a second blocking capacitor ($C_B$) 130. The first blocking capacitor ($C_B$) 128 has a first terminal and a second terminal. The first terminal of the first blocking capacitor ($C_B$) 128 is connected to the second end of the second inductor (L1) 122. The second terminal of the first blocking capacitor ($C_B$) 128 is connected to the reference terminal 140. The second blocking capacitor ($C_B$) 130 also has a first terminal and a second terminal. The first terminal of the second blocking capacitor ($C_B$) 130 is connected to the second end of the fourth inductor (L4) 124. The second terminal of the second blocking capacitor ($C_B$) 130 is connected to the reference terminal 140.

The blocking capacitors ($C_B$) 128, 130 can advantageously perform a function of video decoupling, which can be beneficial for allowing wide video bandwidths.

A node between the first blocking capacitor ($C_B$) 128 and the second inductor (L1) 122 can be considered as a first-DC-feeding-node 134. A node between the second blocking capacitor ($C_B$) 130 and the fourth inductor (L4) 124 can be considered as a second-DC-feeding-node 136. As will be discussed below, as part of the even-mode analysis these nodes can be used to feed DC to the power amplifiers (Q1, Q2) 102, 104.

FIG. 1 also shows that the balun 111 includes a load capacitor 132, which has a first terminal and a second terminal. The first terminal of the load capacitor 132 is connected to the second end of the first inductor (L2) 118. The second terminal of the load capacitor 132 is connected to the reference terminal 140. The load capacitor 132 can also form part of a matching circuit.

In some examples, one or more of the inductors (L2, L1, L3, L4) 118, 122, 120, 124 can be implemented as a lumped equivalent of a transmission line. This can be a convenient way of implementing a planar transformer.

Even-Mode Analysis

Figure 2:
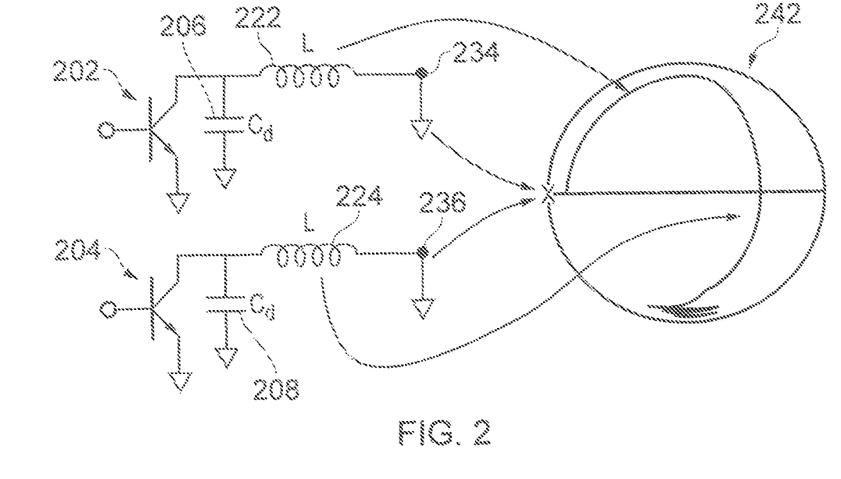
FIG. 2 shows an even-mode equivalent circuit of the PA cell of FIG. 1, along with an associated Smith Chart.

FIG. 2 shows an even-mode equivalent circuit of the PA cell of FIG. 1, along with an associated Smith Chart 242. Components shown in FIG. 2 are given reference numbers in the 200 series, which correspond with the reference numbers of the same components in FIG. 1.

This even-mode analysis is valid for second harmonic as well as base-band frequencies (as the base-band current drawn by the power amplifiers 202, 204 depends on the magnitude of the RF voltages only). The voltages across the first-inductor ($v_{x1}$) and the third-inductor ($v_{x2}$) of FIG. 1 cancel each other, which is why the first-inductor (L2) and the third-inductor (L3) are not shown in FIG. 2. Therefore, the output-current ($i_x$) through the load is reduced to zero. Note that the blocking-capacitors ($C_B$) that are shown in FIG. 1 can be high value capacitors, and therefore they create an electrical short at the fundamental and as well as at second harmonic frequencies. This is why they are not shown in FIG. 2.

As indicated above with reference to FIG. 1, the first-DC-feeding-node 234 and the second-DC-feeding-node 236 can be used to feed DC to the power amplifiers 202, 204.

Figure 3:
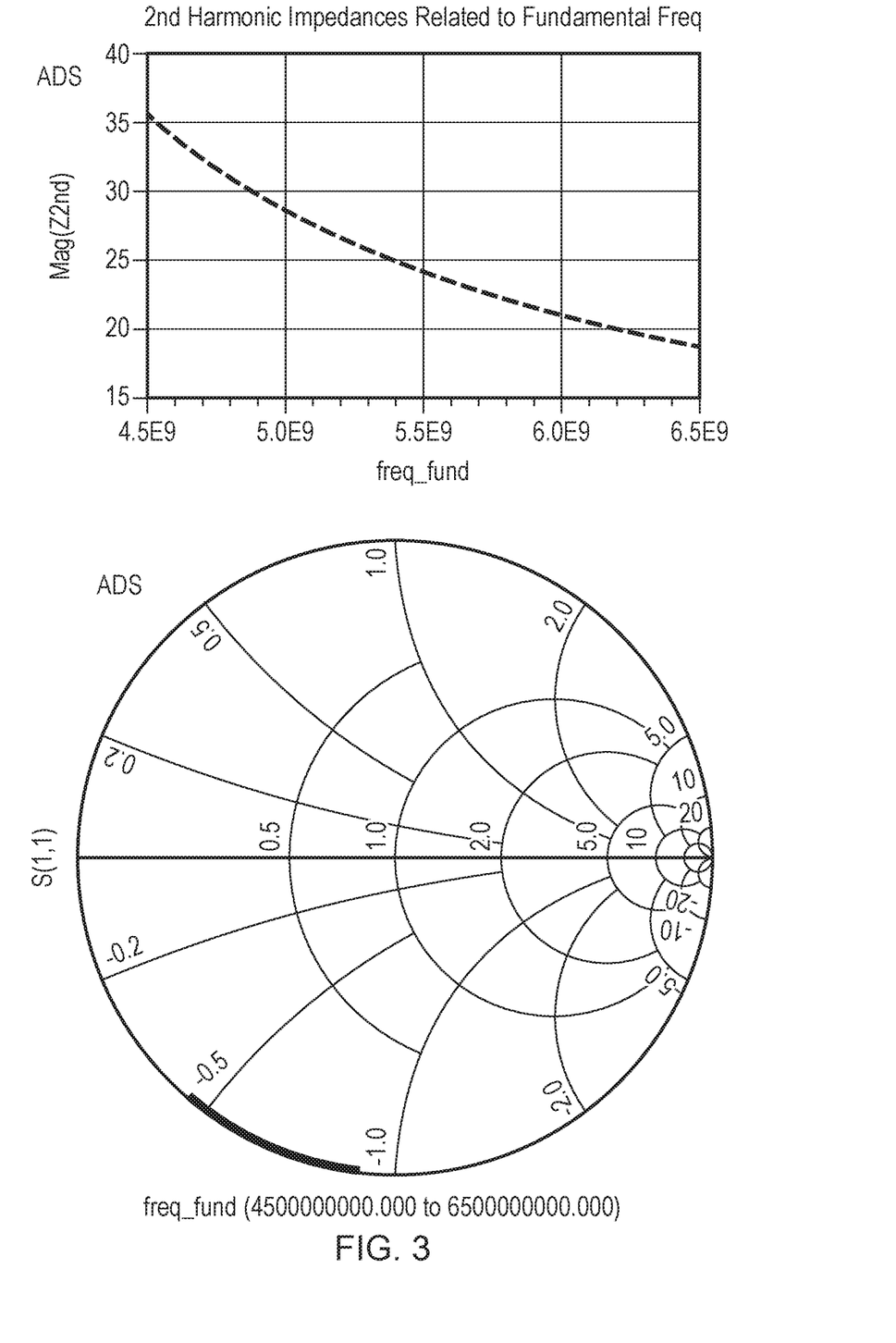
FIG. 3 shows a simulated response for even-mode excitation to the circuit of FIGS. 1 and 2.
Figure 4:
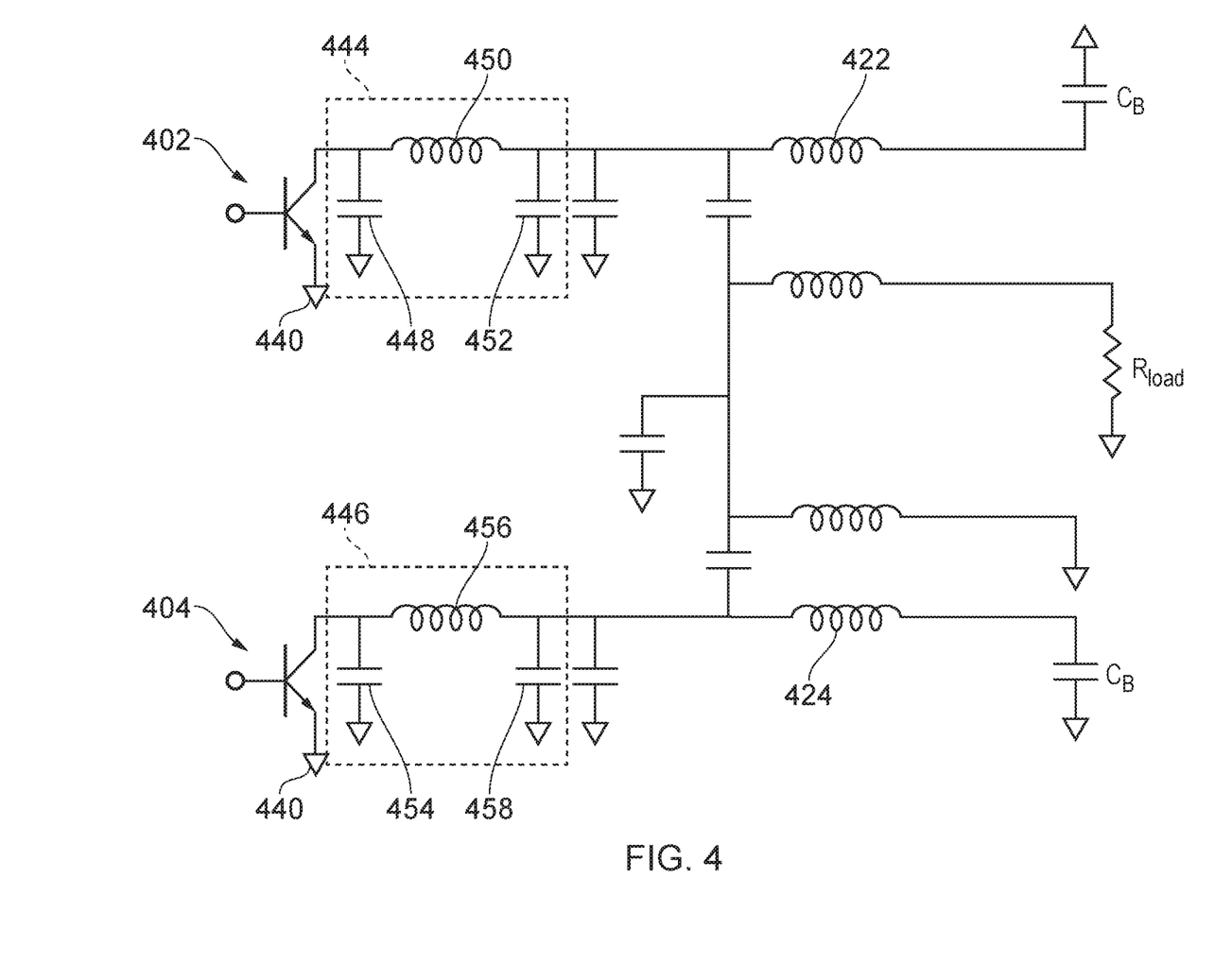
FIG. 4 shows another example embodiment of a power amplifier (PA) cell, which includes a first harmonic-compensation-network and a second harmonic-compensation-network.

FIG. 3 shows a simulated response for even-mode excitation to the circuit of FIGS. 1 and 2. The plots show how the $2^{nd}$ harmonic impedances are related to fundamental frequency. The Smith Chart on the right of FIG. 3 shows S(1,1), which is the input reflection coefficient at the device node (in FIG. 1 the device node is the collector of the PA)

normalized to the optimum load of the PA device. FIG. 4 will be used to describe how the second harmonic impedances can be adjusted by adding an uncoupled inductor/capacitor network in front of the PA devices.

FIG. 4 shows another example embodiment of a power amplifier (PA) cell. The PA cell of FIG. 4 is similar to that of FIG. 1, and corresponding components have been given corresponding reference numbers in the 400 series.

The PA cell of FIG. 4 includes a first harmonic-compensation-network 444 and a second harmonic-compensation-network 446. The first harmonic-compensation-network 444 is connected to the first end of the second inductor 422. In this example, the first harmonic-compensation-network 444 is also connected to the output terminal of the first PA 402. The second harmonic-compensation-network 446 is connected to the first end of the fourth inductor 424. In this example, the second harmonic-compensation-network 446 is also connected to PA output terminal of the second PA 404.

The first harmonic-compensation-network 444 in this example includes two compensation capacitors 448, 452 and a first compensation inductor 450. The first compensation inductor 450 is connected in series between the second inductor 422 and the output terminal of the first PA 402. Either of the two compensation capacitors 448, 452 can be considered as a first compensation capacitor: in FIG. 4, one compensation capacitor 448 is connected in series between (i) the output terminal of the first PA 402, and (ii) the reference terminal 440; and the other compensation capacitor 452 is connected in series between (i) the first end of the second inductor 422, and (ii) the reference terminal 440.

The second harmonic-compensation-network 446 in this example also includes two compensation capacitors 454, 458 and a second compensation inductor 456. Either of the two compensation capacitors 454, 458 can be considered as a second compensation capacitor. The second compensation inductor 456 is connected in series between the fourth inductor 424 and the output terminal of the second PA 404. One of the compensations capacitor 454 is connected in series between (i) the output terminal of the second PA 402, and (ii) the reference terminal 440; and the other compensation capacitor 458 is connected in series between (i) the first end of the fourth inductor 424, and (ii) the reference terminal 440.

Operation of the circuit of FIG. 4 at the video/baseband frequencies is similar to the even-mode analysis shown in FIG. 2.

Figure 5:
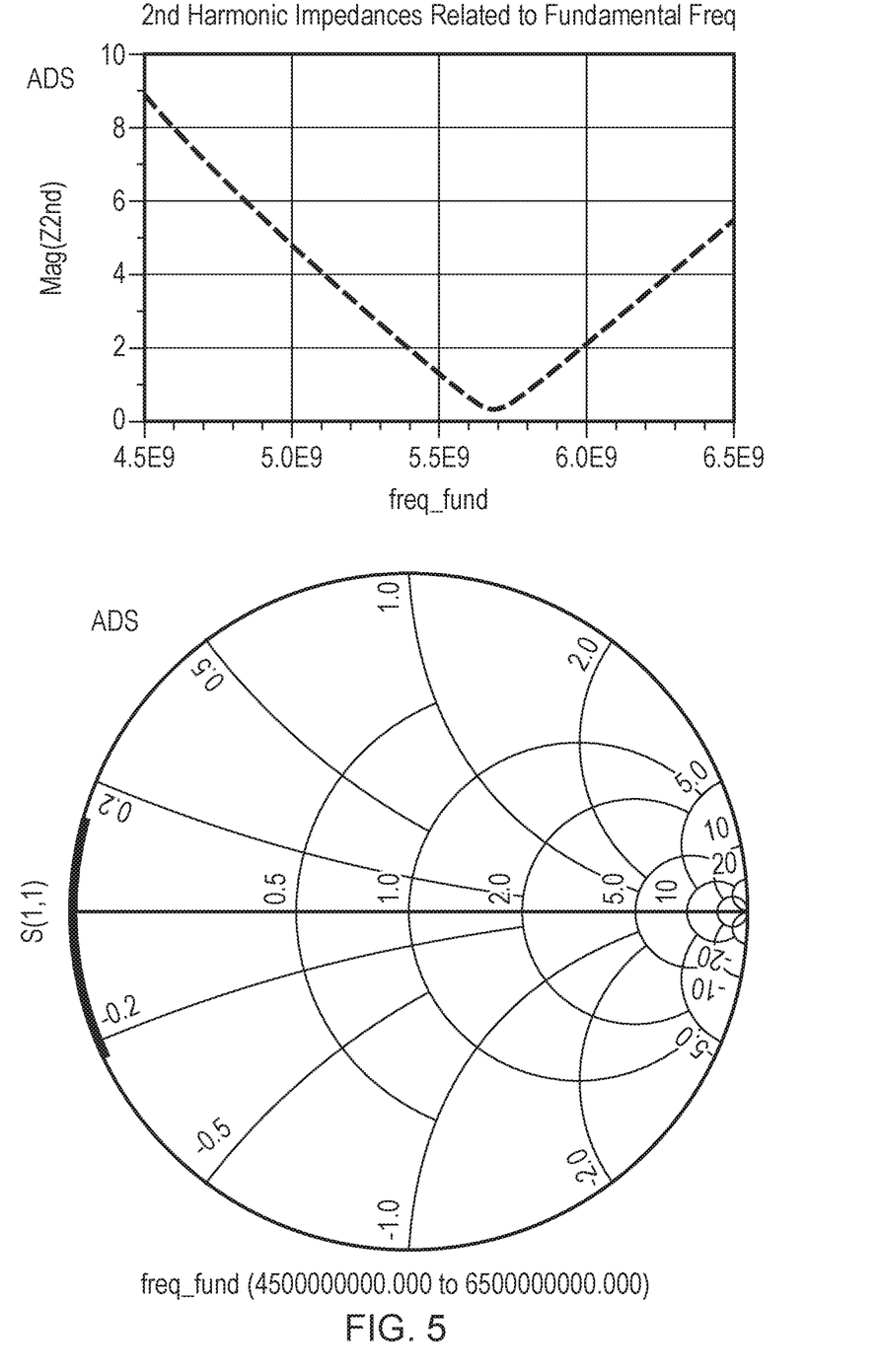
FIG. 5 shows plots of the 2nd harmonic impedances that are presented to the first and second PAs for the circuit of FIG. 4.

FIG. 5 shows plots of the $2^{nd}$ harmonic impedances that are presented to the first and second PAs for the circuit of FIG. 4; that is the circuit with the first and second harmonic-compensation-networks.

Figure 6:
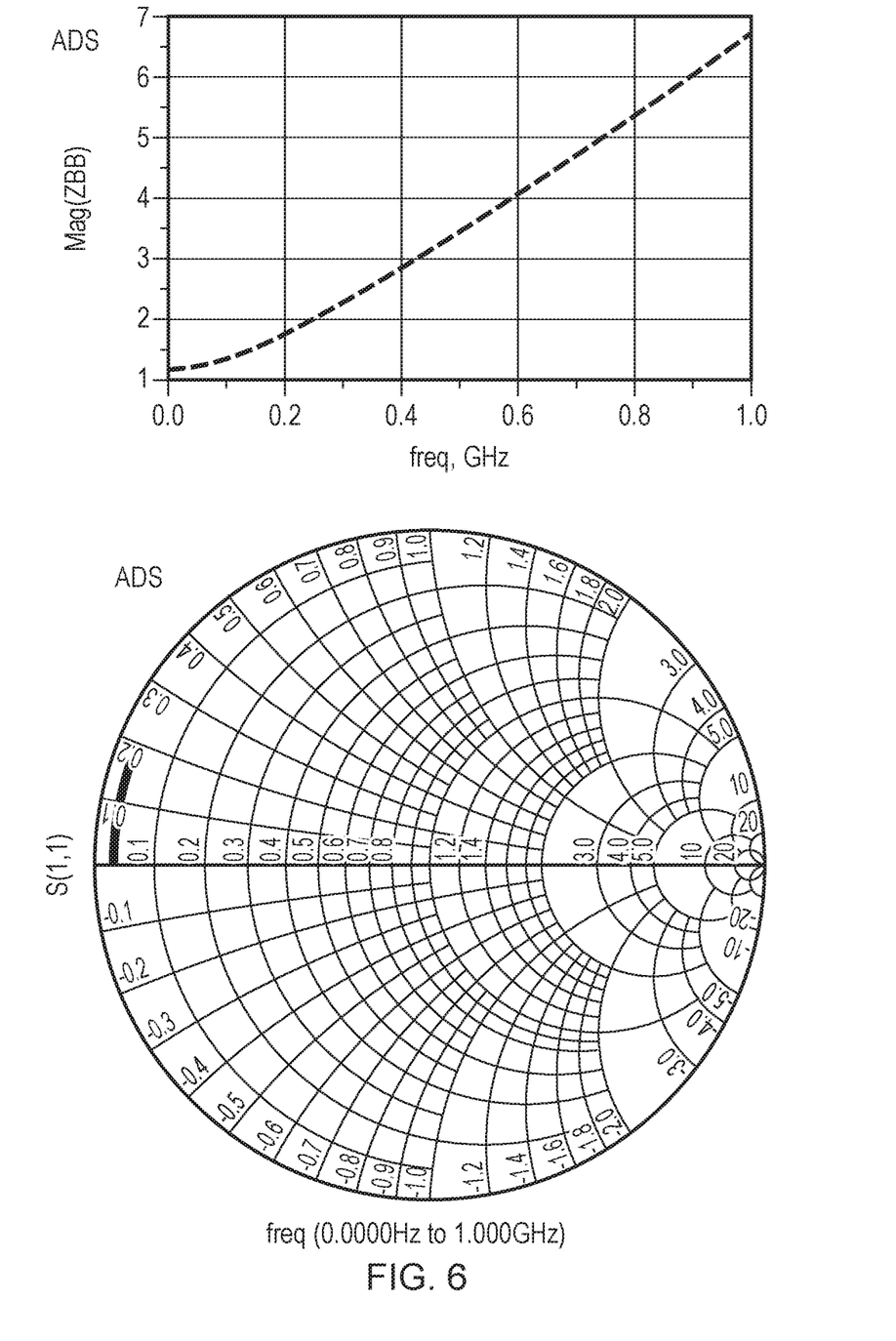
FIG. 6 shows plots of the base-band impedances that are presented to the first and second PAs for the circuit of FIG. 4.

FIG. 6 shows plots of the base-band impedances that are presented to the first and second PAs for the circuit of FIG. 4. Note that the optimum load of the PA device used in this example circuit is 40 Ohm. The impedance is less than 10 times optimum load of the PA device over the frequency range up-to 600 MHz, which would provide excellent performance for wideband modulated signals.

Odd-Mode Analysis

In order to estimate the performance of the circuit of FIG. 1 for fundamental (differential signals), odd-mode analysis is applied to the circuit of the FIG. 1. In this mode, the circuit can be considered as a multi-stage ladder network (not shown) to the output load. Such a multi-stage ladder network can provide very wideband bandwidth. This can be because, in impedance matching, a multi-stage network provides wider bandwidth as the total impedance step is divided into smaller steps.

Figure 7:
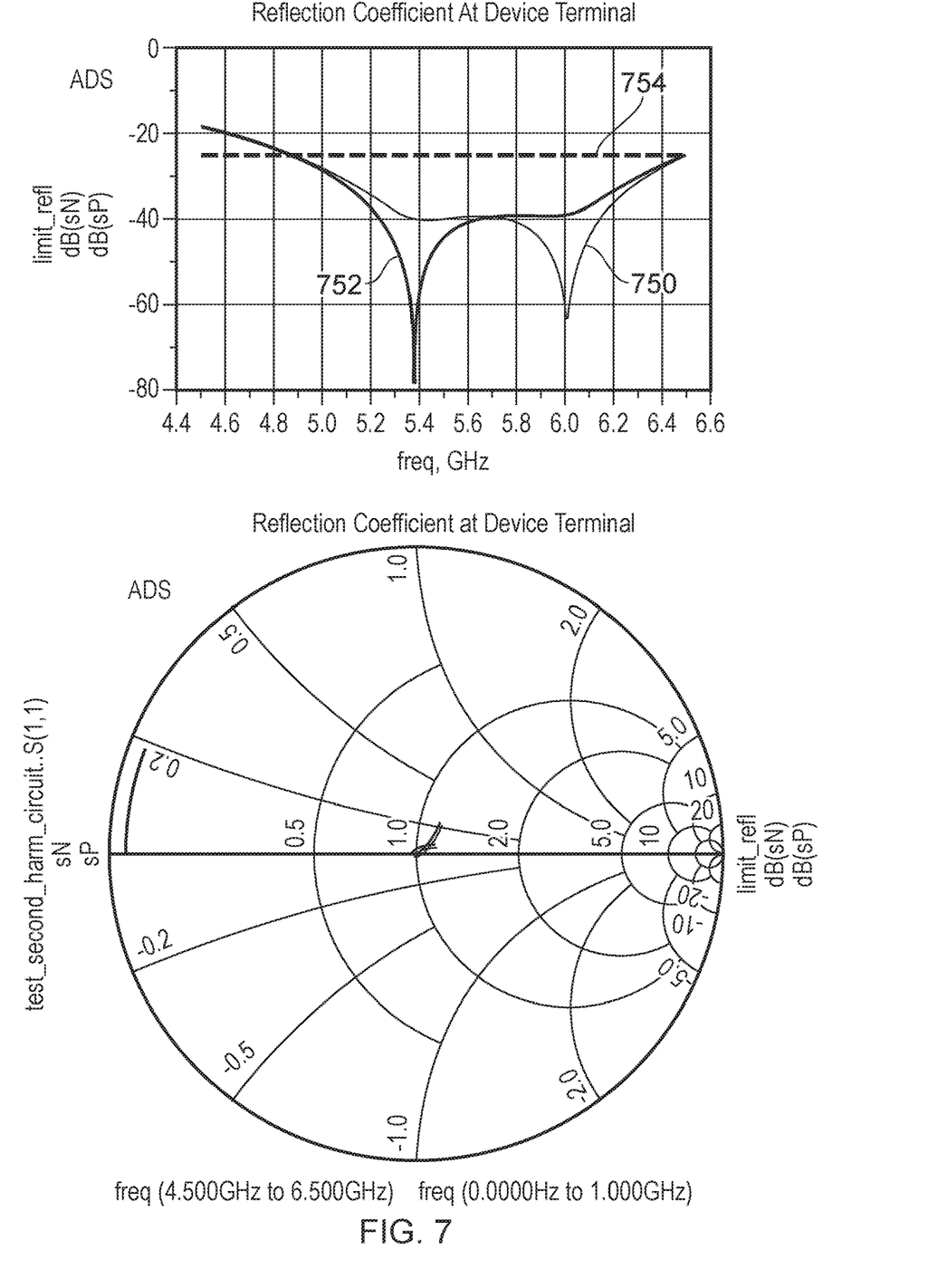
FIG. 7 shows the results of odd-mode analysis of the reflection coefficient at a PA output terminal of the circuit of FIG. 1.

FIG. 7 shows the results of odd-mode analysis of the reflection coefficient at a PA output terminal (the collector of a PA transistor) of the circuit of FIG. 1). FIG. 7 shows that the input reflection coefficient (S11) at the collector of the PA devices (taking out the internal collector capacitance) for the fundamental frequencies under odd-mode excitation conditions. The right-hand plot of FIG. 7 shows two curves: a first curve 750 that represents the impedance seen by the first PA (which can be considered as a positive device), and a second curve 752 that represents the impedance seen by the second PA (which can be considered as a negative device).

The right-hand plot of FIG. 7 also shows a line 754 at −25 dB. FIG. 7 shows that the circuit of FIG. 1 advantageously provides a reflection coefficient that is better than −25 dB over more than 30% fractional bandwidth.

Figure 8A:
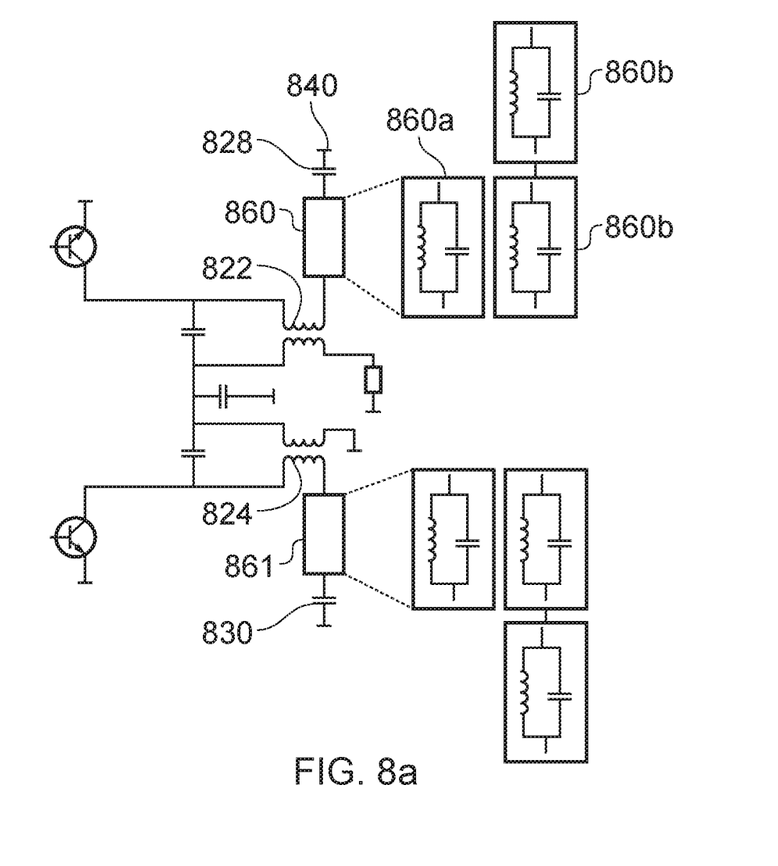
FIGS. 8a and 8b show two further examples embodiment of a power amplifier (PA) cell, which include one or more harmonic-compensation-networks.
Figure 8B:
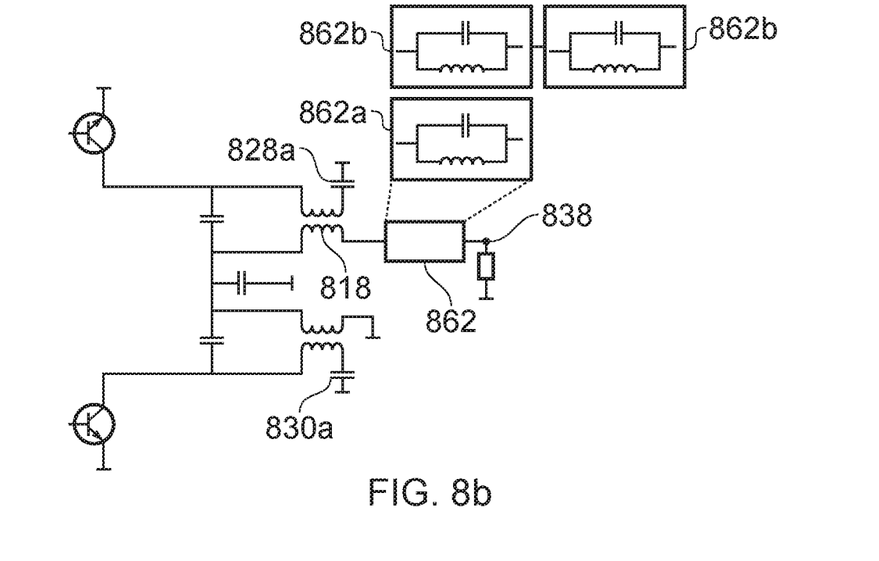

FIGS. 8a and 8b show two further examples embodiment of a power amplifier (PA) cell, which include one or more harmonic-compensation-networks. The PA cells of FIGS. 8a and 8b are similar to that of FIG. 1, and corresponding components have been given corresponding reference numbers in the 800 series. In these examples, the harmonic-compensation-networks can be for higher harmonics. Optionally, the leakage inductances (not shown) of the transformers and/or the blocking-capacitors ($C_B$) 828, 830; 828a, 830a (which may also be referred to as termination capacitances) can be embedded by the harmonic-compensation-networks.

The PA cell of FIG. 8a includes a first harmonic-compensation-network 860 and a second harmonic-compensation-network 861. The first harmonic-compensation-network 860 is connected to the second inductor 822. More particularly, the first harmonic-compensation-network 860 is connected in series between: (i) the second end of the second inductor 822; and (ii) the reference terminal 840.

The first harmonic-compensation-network 860 in this example includes one or more LC networks, wherein each LC network comprises a first compensation capacitor in parallel with a first compensation inductor. If only a single LC network 860a is used, then the first harmonic-compensation-network can be used for $3^{rd}$ harmonic matching. If two LC networks 860b are used in series with each other, then the first harmonic-compensation-network can be used for $3^{rd}$ and $5^{th}$ harmonic matching. It will be appreciated that further LC networks can be used in series with each other to provide matching for higher order harmonics.

The second harmonic-compensation-network 861 can be implemented in any of the ways described with reference to the first harmonic-compensation-network 860, and is connected between the fourth inductor 824 and the reference terminal.

The PA cell of FIG. 8b includes a harmonic-compensation-network 862. The harmonic-compensation-network 862 is connected to the first inductor 818. More particularly, the harmonic-compensation-network 862 is connected in series between: (i) the second end of the first inductor 818; and (ii) the unbalanced node 838.

The harmonic-compensation-network 862 in this example includes one or more LC networks 862a, 862b that can be similar to the harmonic-compensation-networks described with reference to FIG. 8a.

Figure 9:
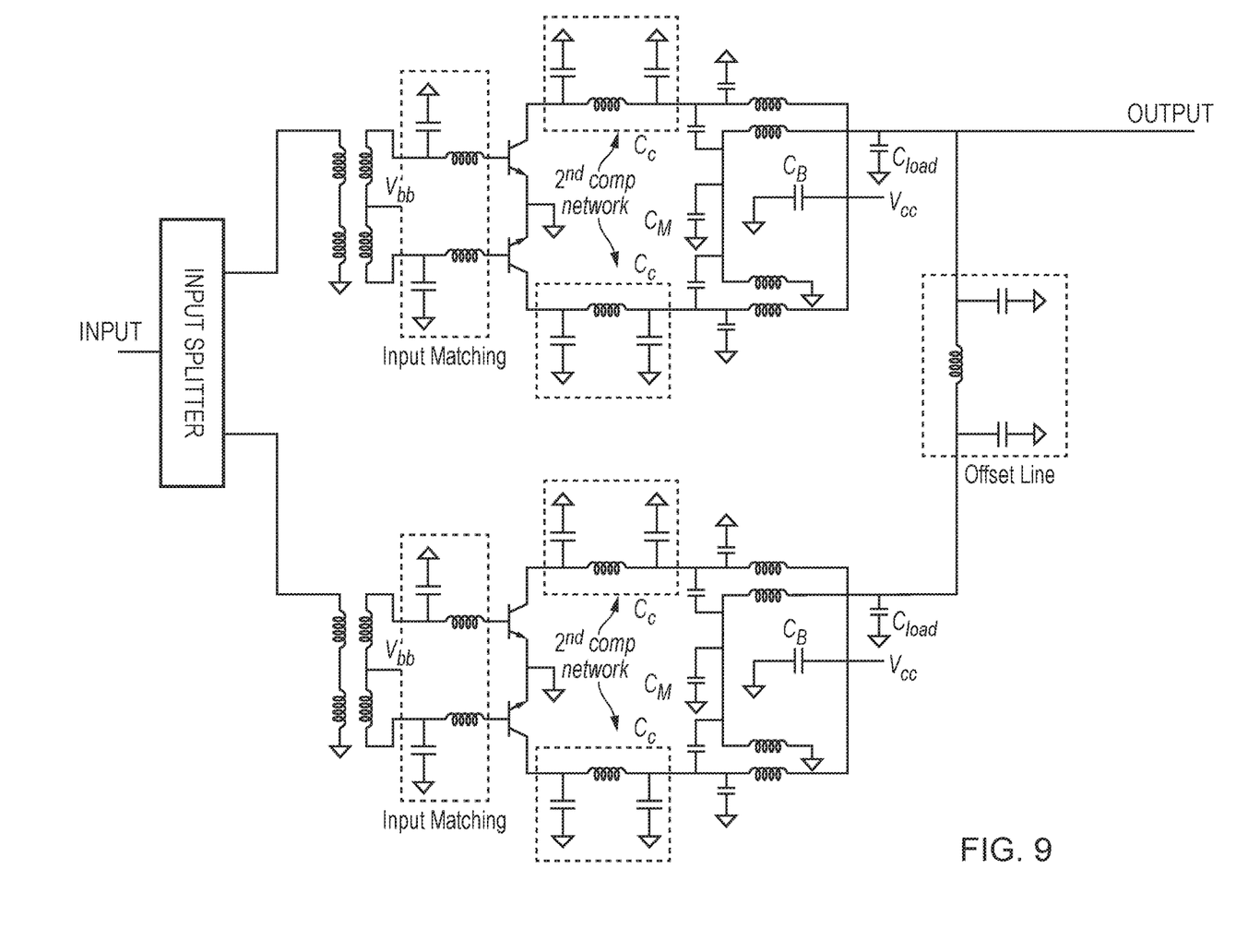
FIG. 9 shows an example embodiment of a wideband PA circuit.

FIG. 9 shows an example embodiment of a wideband PA circuit, which includes transmission line (TL) type delay properties with a delay of less than 45 degrees. At the same time, it does not transform the impedances, which makes its ideal to be used with wideband DPA architectures such as Doherty amplifiers.

Figure 10:
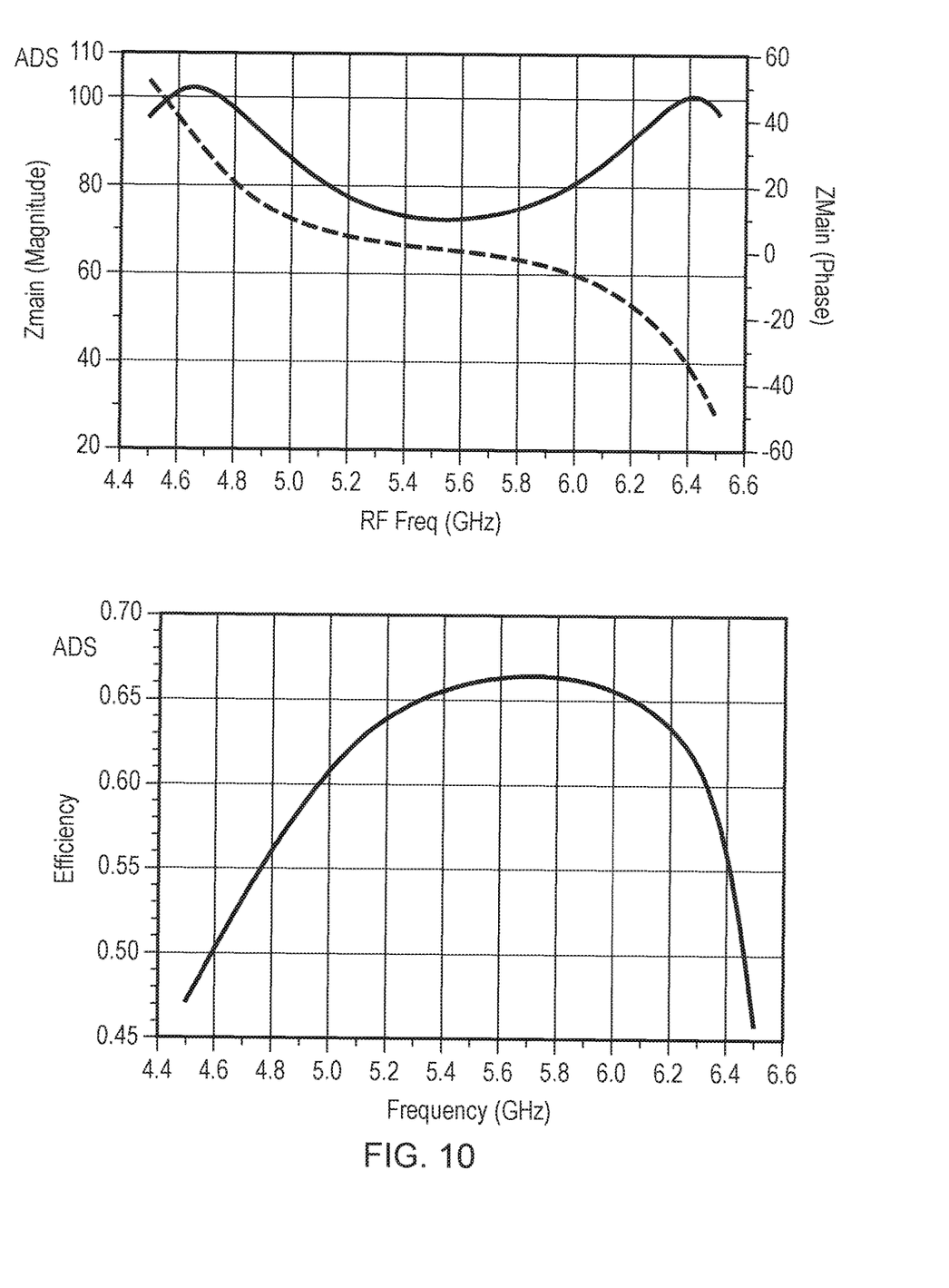
FIG. 10 shows plots of efficiency and impedance of the DPA shown in FIG. 9.

FIG. 10 shows plots of efficiency and impedance of the DPA shown in FIG. 9. FIG. 10 shows a simulated response with real PA devices (Qubic 8G). The lumped components used for generating the results of the FIG. 10 are lossless, and a realistic coupling factor of 0.65 has been used in this example. Such a coupling factor can be obtained by lateral coupling of the transformer coils/inductors.

The top plot of FIG. 10 represents the load seen by the main PA of the DPA at back-off power level, and shows that it is advantageously wideband and is close to a real value (that is, with 0° phase) over the wideband.

Figure 11:
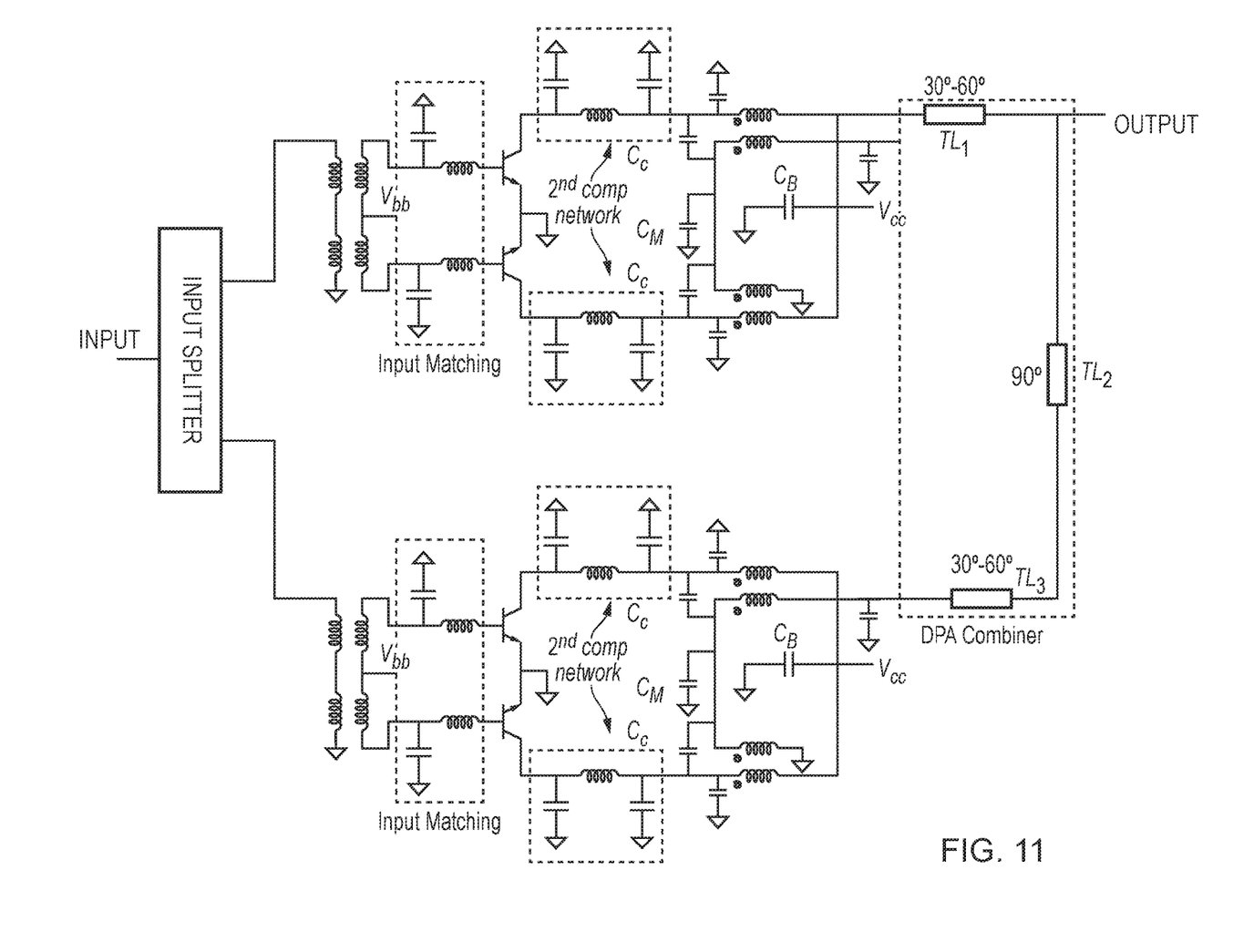
FIG. 11 shows an example of a wideband DPA with a combination of on-chip/off-chip components.

FIG. 11 shows an example of a wideband DPA with a combination of on-chip/off-chip components.

The wideband DPA architectures of FIG. 9 or FIG. 11 can be considered as Doherty amplifier circuits, which include a main amplifier and a peaking amplifier. Wherein the main amplifier and a peaking amplifier are provided by a PA cell that is disclosed herein.

The wideband DPA architectures of FIG. 9 or FIG. 11 can be implemented with on-chip lumped components or a combination of on-chip/off-chip components.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:
1. A power amplifier cell comprising:
a first input terminal configured to receive a first balanced input signal;
a second input terminal configured to receive a second balanced input signal;
an output terminal;
a reference terminal;
a first power amplifier having:
  a first PA input terminal connected to the first input terminal;
  a first PA output terminal;
a second power amplifier having:
  a second PA input terminal connected to the second input terminal;
  a second PA output terminal;
a balun comprising:
  a first balanced node connected to the first PA output terminal;
  a second balanced node connected to the second PA output terminal;
  an unbalanced node connected to the output terminal;
  a first inductor with a first end and a second end, the second end of the first inductor connected to the unbalanced node;
  a second inductor with a first end and a second end, wherein the second inductor is inductively coupled to the first inductor in order to define a first transformer, the first end of the second inductor connected to the first balanced node, and the second end of the second inductor connected to the reference terminal;
  a third inductor with a first end and a second end, wherein the first end of the third inductor is connected to the first end of the first inductor and the second end of the third inductor is connected to the reference terminal;
  a fourth inductor with a first end and a second end, wherein the first end of the fourth inductor is connected to the second balanced node, the fourth inductor is inductively coupled to the third inductor in order to define a second transformer, and the second end of the fourth inductor is connected to the reference terminal;
  a mutual-capacitor having a first terminal and a second terminal, the first terminal of the mutual-capacitor connected to the first end of the first inductor and the first terminal of the mutual-capacitor further con- nected to the first end of the third inductor, the second terminal of the mutual-capacitor connected to the reference terminal;

wherein:
(i) a parasitic capacitance of the first power amplifier; (ii) a leakage inductance of the first transformer; and (iii) a capacitive coupling between the first inductor and the second inductor, are configured to contribute to a first impedance matching circuit for the first power amplifier; and
(iv) a parasitic capacitance of the second power amplifier; (v) a leakage inductance of the second transformer; and (vi) a capacitive coupling between the third inductor and the fourth inductor, are configured to contribute to a second impedance matching circuit for the second power amplifier.

2. The power amplifier cell of claim 1, wherein the first impedance matching circuit is configured to provide impedance matching between the first power amplifier and the balun.

3. The power amplifier cell of claim 1, wherein the second impedance matching circuit is configured to provide impedance matching between second power amplifier and the balun.

4. The power amplifier cell of claim 1 wherein the inductive coupling of the first inductor to the second inductor has an inductive coupling factor of from 0.55 to 0.75, and the inductive coupling of the third inductor to the fourth inductor has an inductive coupling factor of from 0.55 to 0.75.

5. The power amplifier cell of claim 1, wherein:
the leakage inductance of the first transformer is configured to provide sufficient inductance for the first impedance matching circuit without requiring additional components to provide the inductive functionality of the first impedance matching circuit; and
the leakage inductance of the second transformer is configured to provide sufficient inductance for the second impedance matching circuit without requiring additional components to provide the inductive functionality of the second impedance matching circuit.

6. The power amplifier cell of claim 1, wherein:
the first inductor comprises a first lumped equivalent of a transmission line;
the second inductor comprises a second lumped equivalent of a transmission line;
the third inductor comprises a third lumped equivalent of a transmission line; and
the fourth inductor comprises a fourth lumped equivalent of a transmission line.

7. The power amplifier cell of claim 1, wherein:
the inductive coupling factor of the first inductor to the second inductor is defined by the relative spatial arrangement of the first inductor with respect to the second inductor; and
the inductive coupling factor of the third inductor to the fourth inductor is defined by the relative spatial arrangement of the third inductor with respect to the fourth inductor.

8. The power amplifier cell of claim 1, wherein the balun further comprises:
a first coupling capacitor comprising a first terminal and a second terminal, wherein:
the first terminal of the first coupling capacitor is connected to the first end of the first inductor; and
the second terminal of the first coupling capacitor is connected to the first end of the second inductor; and a second coupling capacitor comprising a first terminal and a second terminal;
the first terminal of the second coupling capacitor is connected to the first end of the third inductor; and
the second terminal of the second coupling capacitor is connected to the first end of the fourth inductor.

9. The power amplifier cell of claim 1, wherein the balun further comprises a load capacitor comprising a first terminal and a second terminal, wherein:
the first terminal of the load capacitor is connected to the second end of the first inductor; and
the second terminal of the load capacitor is connected to the reference terminal.

10. The power amplifier cell of claim 1, wherein the balun further comprises:
a first blocking capacitor comprising a first terminal and a second terminal, wherein:
the first terminal of the first blocking capacitor is connected to the second end of the second inductor; and
the second terminal of the first blocking capacitor is connected to the reference terminal; and
a second blocking capacitor comprising a first terminal and a second terminal, wherein:
the first terminal of the second blocking capacitor is connected to the second end of the fourth inductor; and
the second terminal of the second blocking capacitor is connected to the reference terminal.

11. The power amplifier cell of claim 1, further comprising:
a first reactive component having a first terminal and a second terminal, wherein:
the first terminal of the first reactive component is connected to the first PA output terminal; and
the second terminal of the first reactive component is connected to the reference terminal; and
a second reactive component having a first terminal and a second terminal, wherein:
the first terminal of the second reactive component is connected to the second PA output terminal; and
the second terminal of the second reactive component is connected to the reference terminal.

12. The power amplifier cell of claim 1, further comprising:
a first harmonic-compensation-network connected to the second inductor, the first harmonic-compensation-network comprising a first compensation capacitor and a first compensation inductor; and
a second harmonic-compensation-network connected to the fourth inductor, the second harmonic-compensation-network comprising a second compensation capacitor and a second compensation inductor.

13. The power amplifier cell of claim 12, wherein:
the first harmonic-compensation-network is connected to the second end of the second inductor; and
the second harmonic-compensation-network is connected to the second end of the fourth inductor.

14. The power amplifier cell of claim 12, wherein:
the first harmonic-compensation-network is connected to the first end of the second inductor; and
the second harmonic-compensation-network is connected to the first end of the fourth inductor.

15. A Doherty amplifier circuit, which comprises a main amplifier and a peaking amplifier, wherein the main amplifier and the peaking amplifier comprise a power amplifier cell of claim 1.

* * * * *